US009431069B2

United States Patent
Lim et al.

(10) Patent No.: US 9,431,069 B2
(45) Date of Patent: Aug. 30, 2016

(54) MANAGEMENT METHOD FOR NONVOLATILE MEMORY SYSTEM FOLLOWING POWER-OFF

(71) Applicant: SAMSUNG ELECTRONICS CO., LTD., Suwon-Si, Gyeonggi-Do (KR)

(72) Inventors: Chaesuk Lim, Hwaseong-Si (KR); Jinhyuk Kim, Hwaseong-Si (KR); Taekkyun Lee, Suwon-Si (KR); Wonchuri Zoo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 93 days.

(21) Appl. No.: 14/299,706

(22) Filed: Jun. 9, 2014

(65) Prior Publication Data

US 2015/0006939 A1  Jan. 1, 2015

(30) Foreign Application Priority Data

Jul. 1, 2013  (KR) .......................... 10-2013-0076616

(51) Int. Cl.
G06F 11/00 (2006.01)
G11C 5/14 (2006.01)
G11C 29/44 (2006.01)

(52) U.S. Cl.
CPC ....... G11C 5/148 (2013.01); G11C 2029/4402 (2013.01)

(58) Field of Classification Search
CPC ................ G11C 16/105; G11C 5/148; G11C 2029/4402; G06F 11/1441; G06F 1/30; G06F 11/1417; G06F 3/0632; G06F 11/1402; G06F 11/2284; G06F 2212/7209; G06F 3/0619

See application file for complete search history.

(56) References Cited

U.S. PATENT DOCUMENTS

| 5,379,417 A * | 1/1995 | Lui ..................... G06F 11/1076 706/916 |
| 7,127,551 B2 | 10/2006 | Beck |
| 7,181,611 B2 | 2/2007 | Chang et al. |
| 8,028,120 B2 | 9/2011 | Mo et al. |
| 2003/0014690 A1 * | 1/2003 | Frimout .............. G06F 11/1441 714/20 |
| 2006/0059326 A1 * | 3/2006 | Aasheim ............. G06F 12/0246 711/203 |
| 2009/0109786 A1 | 4/2009 | Ye et al. |
| 2010/0070735 A1 | 3/2010 | Chen et al. |
| 2010/0138592 A1 | 6/2010 | Cheon |
| 2010/0169543 A1 | 7/2010 | Edgington et al. |
| 2010/0180068 A1 * | 7/2010 | Matsumoto ......... G06F 11/1441 711/103 |
| 2011/0131365 A1 | 6/2011 | Zhang et al. |
| 2011/0173380 A1 | 7/2011 | Yano et al. |
| 2011/0208898 A1 | 8/2011 | Shin |

FOREIGN PATENT DOCUMENTS

JP  2002-334586 A  11/2002

* cited by examiner

Primary Examiner — Jason Bryan
(74) Attorney, Agent, or Firm — Volentine & Whitt, PLLC

(57) ABSTRACT

A management method for a memory system executes a first memory system management sequence upon determining that the memory system was normally powered off, and a second sequence upon determining that the memory system was abnormally powered off. The first sequence allows immediate execution of a program operation at a valid data page location extracted from stored metadata, while the second sequence allows execution of a program operation only after programming dummy data to at least one erroneous page.

17 Claims, 11 Drawing Sheets

MANAGEMENT METHOD FOR NONVOLATILE MEMORY SYSTEM FOLLOWING POWER-OFF

CROSS-REFERENCE TO RELATED APPLICATIONS

A claim of priority under 35 U.S.C. §119 is made to Korean Patent Application No. 10-2013-0076616 filed Jul. 1, 2013, the subject matter of which is hereby incorporated by reference.

BACKGROUND

The inventive concept relates to memory systems and devices. More particularly, the inventive concept relates to memory systems including a nonvolatile memory device and management methods for same.

Nonvolatile memory is widely used to store data in a manner that ensures the retention of data integrity even when power to the nonvolatile memory device is interrupted. Flash memory is one commercially important type of EEPROM (Electrically Erasable Programmable Read-Only Memory) and is one example of nonvolatile memory. Flash memory is widely used in various electronic apparatuses such as PDAs, cellular phones, digital cameras, MP3 players, game consoles, printers, and so on.

Nonvolatile memory systems (memory systems including one or more nonvolatile memory devices) may be powered off normally or abnormally. A normal power-off is usually performed in response to a determined command (e.g., by a user) and proceeds according to a defined routine that places the memory system in a condition that ensures data integrity upon a following reboot. In contrast, an abnormal power-off is often the result of unintended consequences (e.g. loss of power supply) and may very well result in stored data (user-defined or corresponding metadata) being left in erroneous or unknown states. That is, when a nonvolatile memory is abnormally powered off during a data program operation, for example, invalid data may be stored in one or more memory cells of the nonvolatile memory. Such invalid data may be the result of incomplete or fully errant programming and includes the so-called "soft program state" that results when a memory cell is left programmed to a threshold voltage that is lower than its intended or target threshold voltage. As a result, erroneously stored data may be retrieved during a subsequent read operation upon reboot.

To ensure data accuracy and stability, certain nonvolatile memory management methods have been proposed that prevent the unacceptable data results caused by abnormal power-offs. However, many conventional management methods mandate a high number of erase and re-program operations. Such approaches take a long time to run thereby extending reboot times and also reduce the effective lifetime of the constituent nonvolatile memory cells due to repeated erase operations.

SUMMARY

One embodiment of the inventive concept provides a management method for a memory system including a host and a nonvolatile memory. The method includes determining whether the nonvolatile memory was normally or abnormally powered off in response to at least one of a command provided by the host to the nonvolatile memory and power-off data stored in the nonvolatile memory, and only upon determining that the nonvolatile memory was abnormally powered off, searching for at least one erroneous page among pages of the nonvolatile memory by referencing metadata last stored in the nonvolatile memory before the abnormal power-off. The method further includes programming dummy data in the at least one erroneous pages before performing a normal program operation directed to the nonvolatile memory.

In another embodiment, the inventive concept provides a management method for a memory system including a host and a nonvolatile memory. The method includes, upon rebooting the nonvolatile memory, executing a first management sequence upon determining that the nonvolatile memory was normally powered off, else executing a second management sequence different from the first management sequence upon determining that the nonvolatile memory was abnormally powered off. The first management sequence allows immediate execution of a program operation at a valid data page location extracted from stored metadata, while the second management sequence allows execution of the program operation only after programming dummy data to at least one erroneous page.

In another embodiment, the inventive concept provides a memory device which includes a memory controller and a nonvolatile memory configured to store power-off data and metadata. The memory controller is configured to determine whether the nonvolatile memory was normally or abnormally powered off in response to at least one of a command received from a host and the power-off data, search for at least one erroneous page among pages of the nonvolatile memory by referencing the metadata, last stored before an abnormal power-off, only upon determining that the nonvolatile memory was abnormally powered off, and control the nonvolatile memory to program dummy data in the at least one erroneous page before performing a normal program operation directed to the nonvolatile memory.

BRIEF DESCRIPTION OF THE DRAWINGS

The above and other objects and features of the inventive concept will become more apparent from the following written description with reference to the following figures, wherein like reference numerals may refer to like parts throughout the various figures unless otherwise specified, and wherein.

DETAILED DESCRIPTION

Embodiments of the inventive concept will now be described in some additional detail with reference to the accompanying drawings. However, the inventive concept may be embodied in many different forms and should not be construed as being limited to only the illustrated embodiments. Rather, these embodiments are provided as examples so that this disclosure will be thorough and complete and serve to fully convey the scope of the inventive concept to those skilled in the art. Unless otherwise noted, like reference numbers and labels are used to denote like or similar elements throughout the drawings and written description.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on" or "connected to" another element or layer, it can be directly on or connected to the other element or layer, or intervening elements or layers may be present. In contrast, when an element is referred to as being "directly on" or "directly connected to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
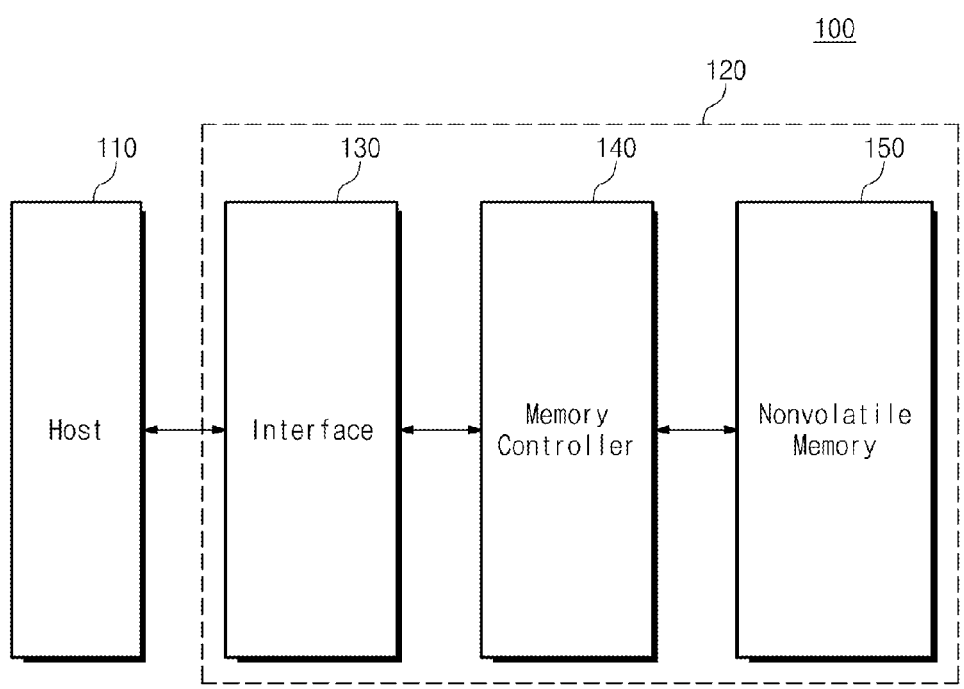
FIG. 1 is a block diagram illustrating a nonvolatile memory system according to an embodiment of the inventive concept.

Figure (FIG. 1 is a block diagram illustrating a system 100 according to an embodiment of the inventive concept. The system 100 generally includes a host 110 and a nonvolatile memory system 120.

The host 110 may be at once a source of "write data" to be stored in the nonvolatile memory system 120 and/or a destination for "read data" retrieved from the nonvolatile memory system 120 in response to one or more command(s) provided by the host 110. Thus, the host 110 may be said to exchange data with the nonvolatile memory system 120 in response to commands that originate, at least in part, from functional interactions with a user. In this regard, it should be noted that that host 110 may take one of many different forms. For example, the host 110 may be an application processor operating within a mobile device in association with the nonvolatile memory system 120.

In the illustrated example of FIG. 1, the nonvolatile memory system 120 includes an interface 130, a memory controller 140, and a nonvolatile memory 150. The interface 130 may be implemented using any one of a number of conventionally understood circuits and associated software. However physically implemented, the interface 130 enables the exchange of read data and/or write data (hereafter, singularly or collectively "read/write data") as well as associated address information, commands, instructions, control signals, etc. between the nonvolatile memory device 120 and host 110.

The nonvolatile memory 150 may take different forms and may be implemented using one or more types of nonvolatile memory (e.g., NAND flash, NOR flash, PRAM, MRAM, etc.). One possible implementation of the nonvolatile memory 150 is described with reference to FIG. 2 and assumes the use of flash memory.

The memory controller 140 controls the overall operation of the nonvolatile memory 150, and exemplary functions that may be performed by the memory controller 140 in certain embodiments of the inventive concept will be described in some additional detail with reference to FIGS. 4 and 5.

Figure 2:
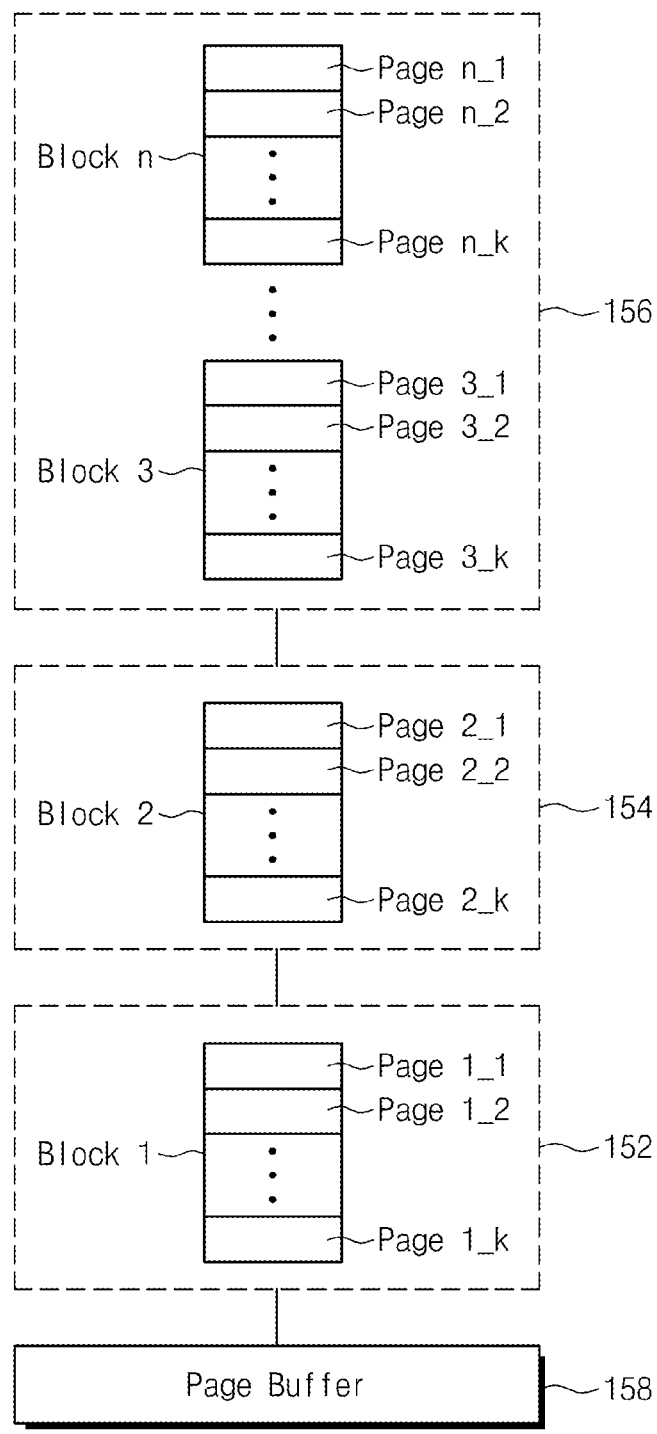
FIG. 2 is a block diagram further illustrating the nonvolatile memory of FIG. 1.

FIG. 2 is a block diagram further illustrating the nonvolatile memory 150 of FIG. 1 according to an embodiment of the inventive concept. As will be conventionally appreciated, the memory cell array (i.e., one or more area(s) wherein constituent memory cells are arranged within the nonvolatile memory 150) may be functionally (or logically) divided into a number of memory blocks (e.g., Block 1 to Block n shown in FIG. 2). Each memory block is includes a number of cell strings, wherein each cell string includes a series of memory cells arranged between a string selection transistor and a ground selection transistor. This arrangement of flash memory cells, for example, and its basic functionality are conventionally understood and will not be reiterated here.

As will also be conventionally appreciated, each memory block of FIG. 2 may be further divided into a number of pages (e.g., Page 1_1 to Page 1_k for Block 1). In certain embodiments of the inventive concept, the memory cells assigned to a particular page will be commonly connected to the same word line within the memory cell array of the nonvolatile memory 150.

The various logical divisions across the memory cell array of the nonvolatile memory 150 may be assigned different purposes by the memory system 120 and/or host 110. For example, metadata (i.e., administrative or device management data associated with the operation of the memory system 120) may be stored in metadata storing area (e.g., one or more designated memory block(s) and/or page(s)). In contrast, user (or payload) data (i.e., data generated in response to a user input to the system 100) may be stored in user data storing area (e.g., one or more designated memory block(s) and/or page(s) separate from designated metadata storing areas).

Thus, as illustrated in FIG. 2, the nonvolatile memory 150 may include separately designated meta data storing areas 152 and 154 respectively provided by Blocks 1 and 2, as well as a user data storing area 156 provided by the combination of Block 3 through Block n. In the illustrated configuration of nonvolatile memory 150 shown in FIG. 2, each of these designated data storing areas may be accessed (i.e., read from and/or written to) via a conventionally configured page buffer 158.

As suggested above, a class or type of data generically referred to hereafter as "power-off data" will be generated during a power-off routine for the system 100 or power-off of memory system 120. In this regard, power-off data may be stored in one or more "power-off data storing areas" of the memory cell array provided by nonvolatile memory 150.

It is possible for various data types (e.g., metadata) to be distributed over a number of different designated storing areas. Hence, location information or "location data" describing (or indexing) these various locations for a particular data type may be stored in one or more designated "location data storing areas".

Hence, with reference to FIG. 2, it is assumed that both power-off data and location data associated with metadata are stored in respective and particularly designated page(s) of memory area 152 provided by Block 1 to respectively form a power-off data storing area and a metadata location storing area. Actual metadata is stored in one or more designated page(s) of a metadata storing area 154 provided by Block 2, and user data is stored in designated pages of the user data storage area 156 provided by Blocks 3 through n. Examples of the nature and storing of the power-off data, metadata location data, metadata, and user data will be described in some additional detail hereafter with reference to FIGS. 3, 4, 5, 6 and 7.

It should be noted at this point that the first memory 152 used to store metadata location data and power-off data, the second memory area 154 used to store metadata, and the third memory area 156 used to store user data have respective fixed locations within the memory cell array of the nonvolatile memory 150 and are used to store a predetermined type of data. It should also be noted that any reasonable number of memory blocks and/or pages in various arrangements may be used for the foregoing purposes and designations, whereas FIG. 2 illustrates only a single, simple example for clarity of explanation.

Figure 3:
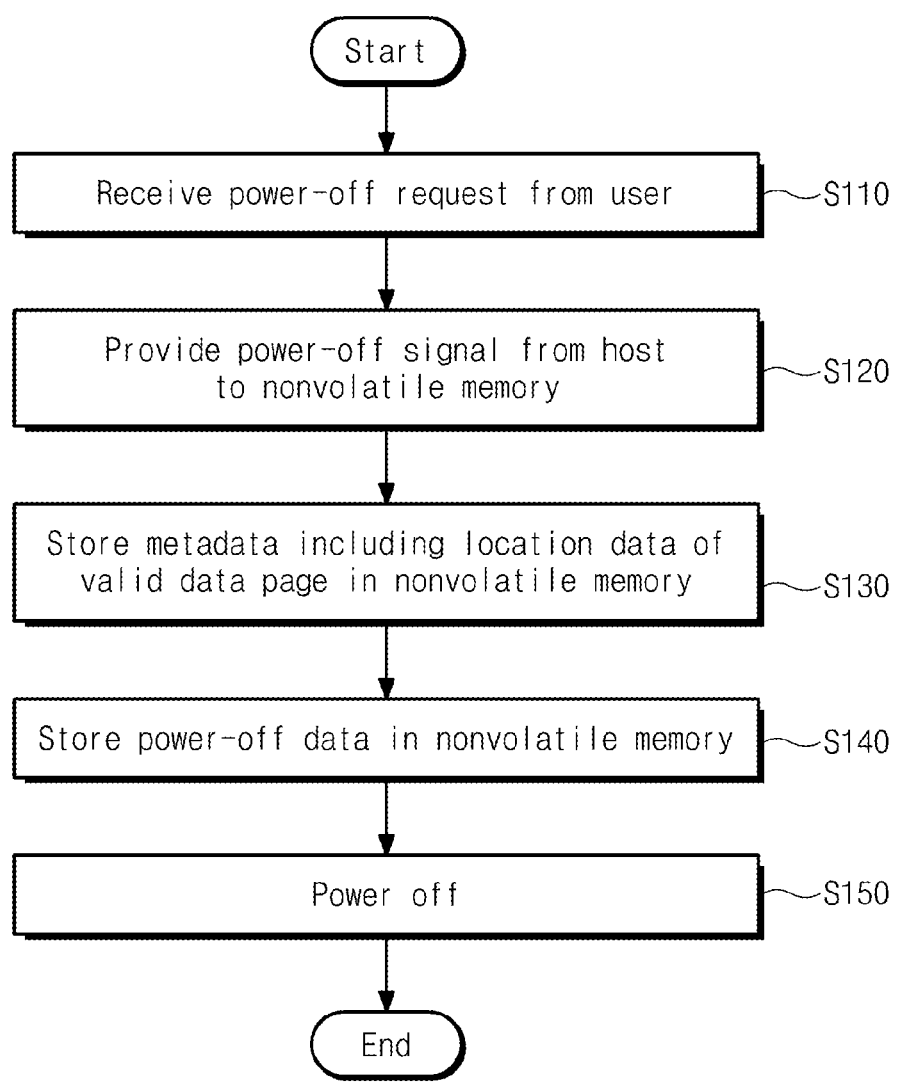
FIG. 3 is a flow chart illustrating a power-off method for a nonvolatile memory device according to an embodiment of the inventive concept.

FIG. 3 is a flow chart illustrating a normal power-off routine that may be performed by a system including a memory system according to an embodiment of the inventive concept. The illustrated routine begins when a system power-off request (e.g., a power-off request initiated by a user) is received (S110). As has been suggested above, receipt of a system power-off request initiates a normal power-off routine during which the memory system 120 should have sufficient time and resources (e.g., power) to place memory system resources in proper order to ensure correct disposition upon reboot.

Thus, in response to a power-off request regularly received by the host 110, the host 110 will then generate a corresponding power-off signal and communicate same to the memory system 120 (S120).

In response to the received power-off signal, the memory controller 140 will cause current metadata being used by the memory system 120 to be stored in the nonvolatile memory 150 (S130). In particular, it is assumed that the metadata includes a "valid data page location" indicating the location of a page at which valid data may be programmed upon reboot of the nonvolatile memory system 120, and the nonvolatile memory 150 in particular. For example, the metadata stored during a normal power-off routine may be stored in the metadata storing area 154 of Block 2 as described in relation to FIG. 2.

In addition to storing current metadata during a normal power-off routine, associated power-off data will be stored in the nonvolatile memory 150 (S140). That is, in response to the power-off signal, the memory controller 140 will cause power-off data and metadata location data to respectively be stored in the storing area 152 of Block 1 as described in relation to FIG. 2.

Finally, after the foregoing, the memory system 120 including the nonvolatile memory 150 is powered off (S150). As a result, when the memory system 120 is normally powered off, valid and properly corresponding power-off data and metadata will be safely stored in the nonvolatile memory 150 according to an established power-off routine.

Figure 4:
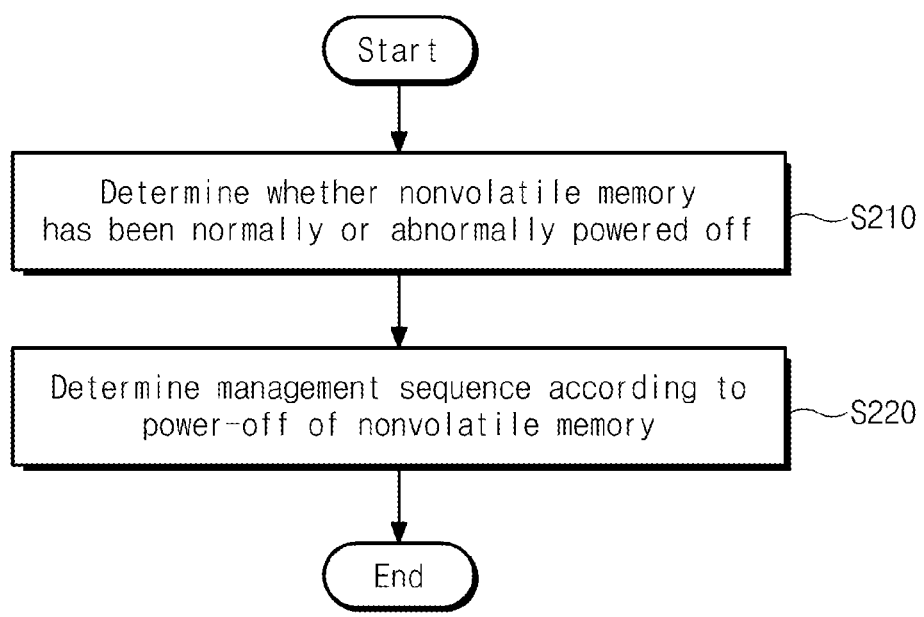
FIGS. 4 and 5 are respective flow charts illustrating management methods for a nonvolatile memory device according to embodiment(s) of the inventive concept.

FIG. 4 is a flow chart illustrating a management method that may be used by a nonvolatile memory system according to an embodiment of the inventive concept. The illustrated management method may be executed as part of a boot-up routine for the memory system 120 once power is again supplied.

Thus, during a host device or memory system reboot routine, a determination is made as to whether the nonvolatile memory 150 of the memory system 120 was normally or abnormally powered-off (S210). As noted above, an abnormal power-off is any power-off (e.g., a withdraw of power) of a nonvolatile memory other than a power-off performed according to an established power-off routine that ensures the accuracy of at least the metadata and power-off data for a memory system including the nonvolatile memory. A determination of normal verses abnormal power-off may be made with reference to a command provided from the host 110 to the nonvolatile memory system 120, and/or the constituent nature of the power-off data stored in a designated power-off storing area of the nonvolatile memory 150. One approach to the determination of a normal verses abnormal power-off will be more fully described with reference to FIG. 5.

In view of the determination of a normal verses abnormal power-off, a memory system management sequence is determined for use during the ongoing memory system reboot (S220). Hence, the particular memory system management sequence used during reboot to appropriately place the memory system 120 and nonvolatile memory 150 is working order will vary according to the determination of previous power-off conditions (normal verse abnormal).

In certain embodiments of the inventive concept, the determination of a previous power-off as being normal or abnormal (S210) and the corresponding determination of memory system management sequence will be made under the control of the memory controller 140.

Figure 5:
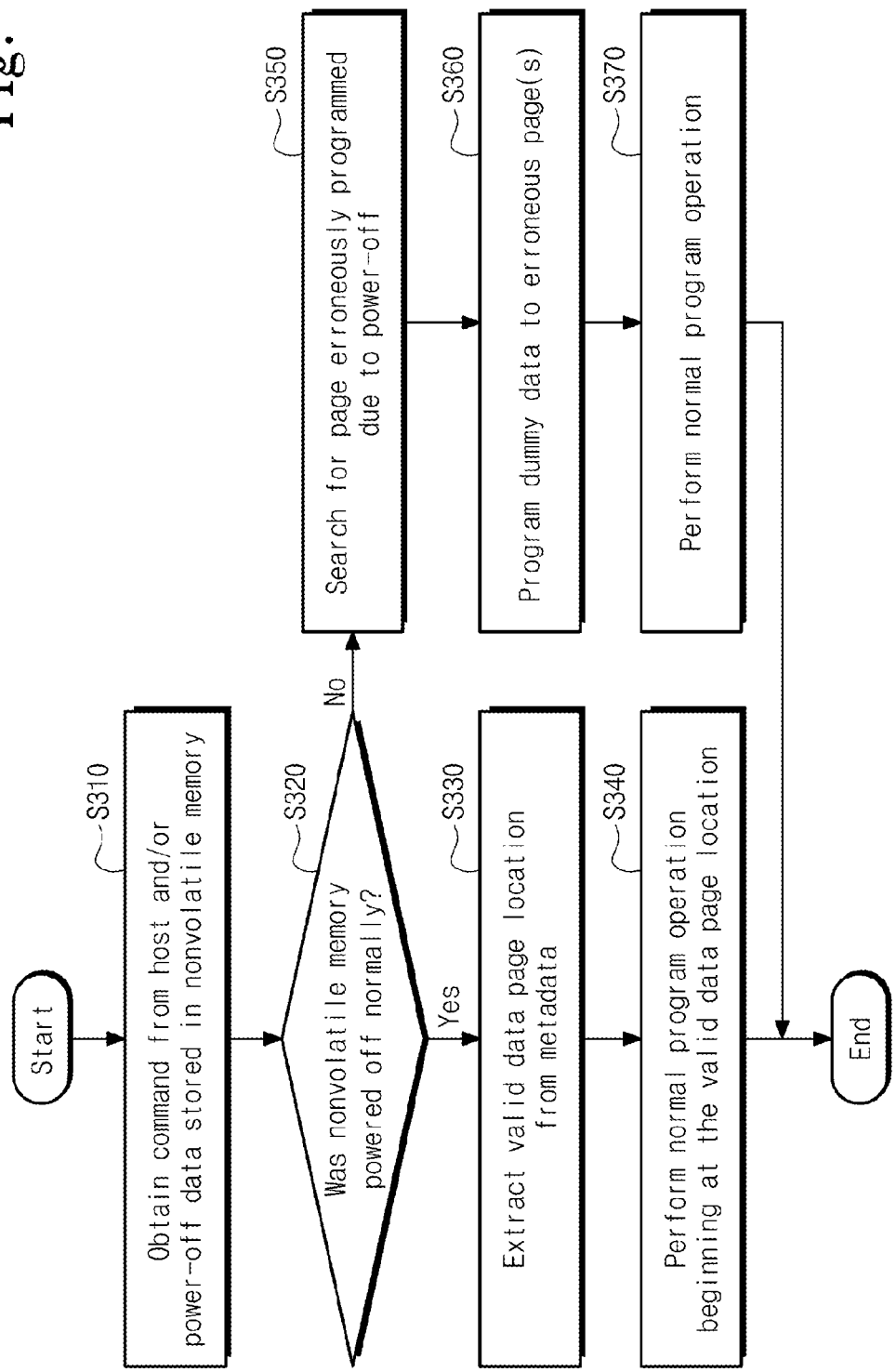

FIG. 5 is a flow chart illustrating a management method that may be used by a nonvolatile memory device according to an embodiment of the inventive concept. It is assumed that the illustrated management method begins when power is again supplied to a powered-off nonvolatile memory 150 and the memory system device 120 is rebooted. The management method of FIG. 5 address two (2) reboot options; one when the memory system 120 has been normally powered off and another when the memory system 120 has been abnormally powered off.

The illustrated management method of FIG. 5 begins by obtaining at least one command provided from the host 110 to the memory system 120 and also obtaining the power-off data currently stored at a designated power-off storing area of the nonvolatile memory 150 (S310).

In certain embodiments of the inventive concept, data indicating whether the memory system 120 was powered off normally or abnormally is stored in a memory or control register of the host 110. Once power is again supplied to the memory system 120 including the nonvolatile memory 150 upon reboot, the host 110 will provide a command including power-off indication information that characterizes the previous power-off type (normal verses abnormal) for the memory system 120.

For example, in response to a user-initiated power-off request, the memory system 120 will provide a (normal) power-off signal to the memory system 120. In response to the power-off signal, the memory controller 140 will cause the nonvolatile memory 150 to store appropriate power-off data and metadata location data in the designated storing area 152. Upon acknowledgement of successful execution of these functions by the memory system 120, the host may internally store the corresponding power-off indication information in preparation for the subsequent reboot. However, other approaches and indications by a host and/or the memory system differentiating between a normal verses abnormal power-off may be used.

For example, in the alternative, the determination of whether the memory system 120 was normally or abnormally powered-off may be made with reference to the power-off data stored in the nonvolatile memory 150. That is, if valid power-off data is not stored in the nonvolatile memory 150, it may be determined that the previous power-off of the memory system 120 was abnormal. Of course, some combination of host command information and stored power-off data may be used to determine whether the memory system 120 was normally or abnormally powered-off.

Using any competent approach to the indication of previous power-off conditions and upon reboot, it may be determined whether the memory system 120 was normally or abnormally powered-off (S320).

Upon determining that the memory system 120 was normally powered-off (S320=Yes), a valid data page location may be extracted from metadata stored in the nonvolatile memory 150 (S330). That is, information indicating a particular page at which valid data should be programmed upon reboot (the "valid data page location") may be stored as a part of general metadata routinely stored by the memory system 120 during power-off. When the memory system 120 has been normally powered off, appropriate and corresponding metadata will be stored in a designated metadata storing area (e.g., 154 of FIG. 2) and this metadata will include the valid data page location.

Once the valid data page location information has been extracted from the stored metadata during reboot of the memory system following a normal power-off, a ("normal" or functionally routine) programming operation may be performed for write data provided by the host 110 (S340). The programming operation may be directed to memory cells in a page area corresponding to the extracted valid data page location.

Hence, when the memory system 120 has been normally powered off, valid data may be normally programmed to a page area corresponding to a location indicated by the metadata stored in the nonvolatile memory 150 during the previous normal power-off routine.

However, upon determining that the memory system 120 was abnormally powered-off (S320=No), the memory controller 140 may search the nonvolatile memory 150 in order to identify an "erroneous page" that was improperly (or incompletely) programmed due to the abnormal power-off of the memory system 120 (S350). As noted above, valid metadata and/or valid power-off data may not be properly programmed to the nonvolatile memory 150 as the result of an abnormal power-off. Hence, the data that might be read from designated storing areas for metadata and power-off data cannot be trusted (i.e., is deemed invalid), and the searching operation is required to identify one or more erroneous page(s).

It may be determined whether or not a particular page of the nonvolatile memory 150 is erroneous by searching each and every page beginning with a designated first page. However, this approach is often very inefficient. Instead, certain embodiments of the inventive concept will determined whether or not a page is erroneous by beginning with a "last page location" as indicated by the metadata last stored by the memory system 120 before the previous power-off. As a result, a search of all pages may not be necessary to identify an erroneous page.

Whether a particular page is erroneous may be determined on the basis whether it is a "next page" associated with a page wherein valid data was last programmed before the previous power-off. When the memory system 120 has been abnormally powered-off, it is highly possible that an identified next page may be an erroneous page. However, those skilled in the art will recognize that there are many different approaches that may be used to identify an erroneous page resulting from an abnormal power-off. These approaches may rely upon control information stored by the host and/or control information stored by the memory controller or nonvolatile memory.

Once an erroneous page has been identified as the result of the abnormal power-off, the memory controller 140 may cause "dummy data" to be programmed to one or more page(s) including the erroneous page (S360). As will be appreciated by those skilled in the art, dummy data is meaningless place-holder data that is unrelated to any user data. It merely serves to place the memory cells of the erroneous page in one or more known data states. Hence, a particular page being accessed during an abnormal power-off may be overwritten with known data to remedy the possibility that certain memory cells of the erroneous page may presently be programmed according to an erroneous (and unknown) soft program state.

Hence, to avoid retrieving read data during a subsequent read operation from memory cells erroneously programmed to a soft program state, dummy data is programmed to page(s) identified as erroneous pages. As has been noted above, a next-to-be-programmed page logically following a last page known to have been properly programmed may be identified as an erroneous page, but this is just a simple example. Other more complicated approaches to the identification of erroneous pages may be used. For example, where write data is distributed over more than one page during normal programming operations, multiple pages may be identified as erroneous pages. In another example, error correction data or parity data may be used to identify erroneous pages.

However identified during a competent searching function (S350), each erroneous page may be overwritten with dummy data to place the constituent memory cells in a known data state (S360). Of course, the nature of the dummy data may be variously determined. For example, the dummy data may be data corresponding to valid data last stored before the abnormal power-off. In this case, if the same data is sequentially programmed in two or more pages, the first one is regarded as valid data and the others are regarded as dummy data. Alternatively, the dummy data may be predetermined pattern of data. In this case, if the predetermined pattern of data is read, it is regarded as dummy data such that it is not used for operations of the host 110 and/or the nonvolatile memory device 120.

Once each page identified as an erroneous page has been placed in a known data state by the programming of defined dummy data, normal programming operations may be resumed to pages of the nonvolatile memory 150 (S370). Thus, the effect of one or more erroneous pages due to an abnormal power-off may be "rehabilitated" after a fashion according to the foregoing approach.

The memory cells of a page "next to" (e.g., physically or logically adjacent to) an erroneous page having dummy data programmed thereto need not suffer from the possibility of a soft programming error. Thus, normal program operations may be directed to pages next to a rehabilitated erroneous page without concern for possible soft programming errors.

According to certain embodiments of the inventive concept, a previous power-off type (normal verses abnormal) for a memory system including a nonvolatile memory may be determined in relation to a command provided from a host to the memory system, and/or power-off data stored in the nonvolatile memory. Thus, re-initialization of the memory system may be accelerated when a previous normal power-off routine is ascertained, while erroneous pages caused by an abnormal power-off may be accounted for.

As a result, particular ways of allocating new memory block(s) after reboot may be improved when a nonvolatile memory has been abnormally powered off. In certain embodiments of the inventive concept, dummy data will be programmed to identified erroneous page(s), and normal program operations will continue using pages following rehabilitated erroneous pages. Thus, it is possible to reduce the number of pages that must be abandoned due to a nonvolatile memory being abnormally powered off, and a corresponding number of erase operations directed to a particular memory block may be reduced. Thus, it is possible to extend the useful lifespan of the nonvolatile memory.

Figure 6:
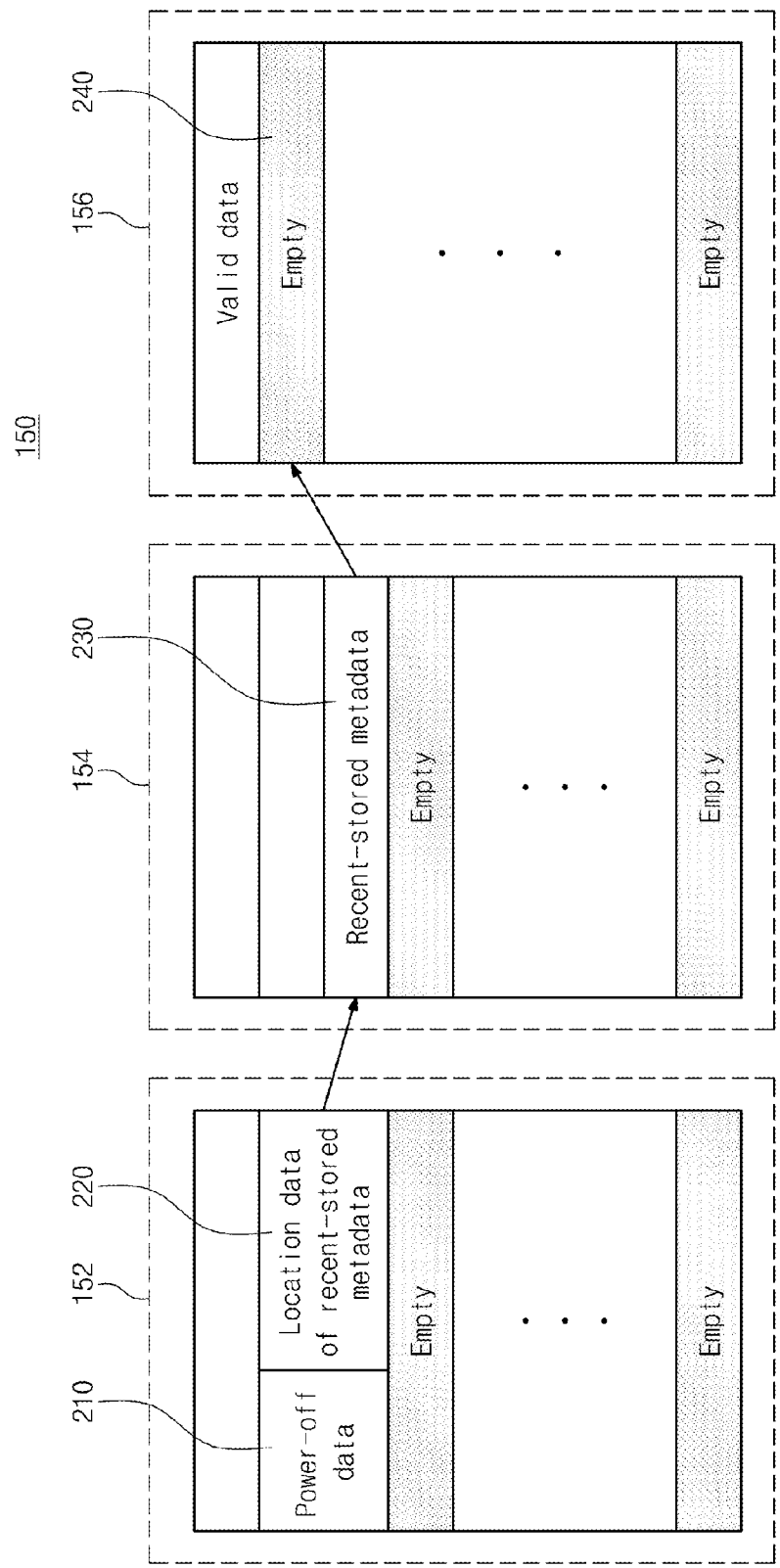
FIGS. 6 and 7 are conceptual diagrams describing a management process for a memory system according to an embodiment of the inventive concept.

FIG. 6 is a conceptual diagram further describing a management method for a nonvolatile memory system incorporated in an embodiment of the inventive concept. In particular, FIG. 6 shows a management method assuming the system described in FIGS. 1 and 2 following a normal powered off. Thus, FIG. 6 assumes the use of the nonvolatile memory 150 storing power-off (P-O) data and metadata location (M-L) data in P-O & M-L storing area 152, as well as metadata storing area 154, and user data storing area 156.

Because the nonvolatile memory device 120 is assumed to have been be normally powered off, accurate power-off data 210 is assumed to be stored in the P-O data & M-L storing area 152. Hence, the memory controller 140 may be used to determine that previous power-off of the memory system 120 was normal based on presence of accurate power-off data 210. Accurate metadata location data 220 specifying the stored location(s) of metadata is also stored in the P-O & M-L storing area 152.

After the memory controller 140 determines the previous power-off type (normal verses abnormal) for the memory system 120 and reboot is enabled, the memory controller 140 may at an appropriate time reset the value of data stored in the P-O & L-M area to some default value. Thus, it is possible to prevent "old" power-off data and/or "old" metadata location data from wrongly being interpreted as indicating a previous normal power-off following an abnormal power-off.

Then, the recently stored metadata 230 may be searched in the metadata storing area 154 using the metadata location data 220. Here, the memory controller 140 may extract a location of a page 240 at which valid data may be programmed in the user data storing area 156.

As a result, valid data may be continuously programmed beginning at page 240, and since the previous power-off of the memory system 120 was normal, reboot time may be sharply reduced by merely extracting a location of a page where valid data may be programmed.

Figure 7:
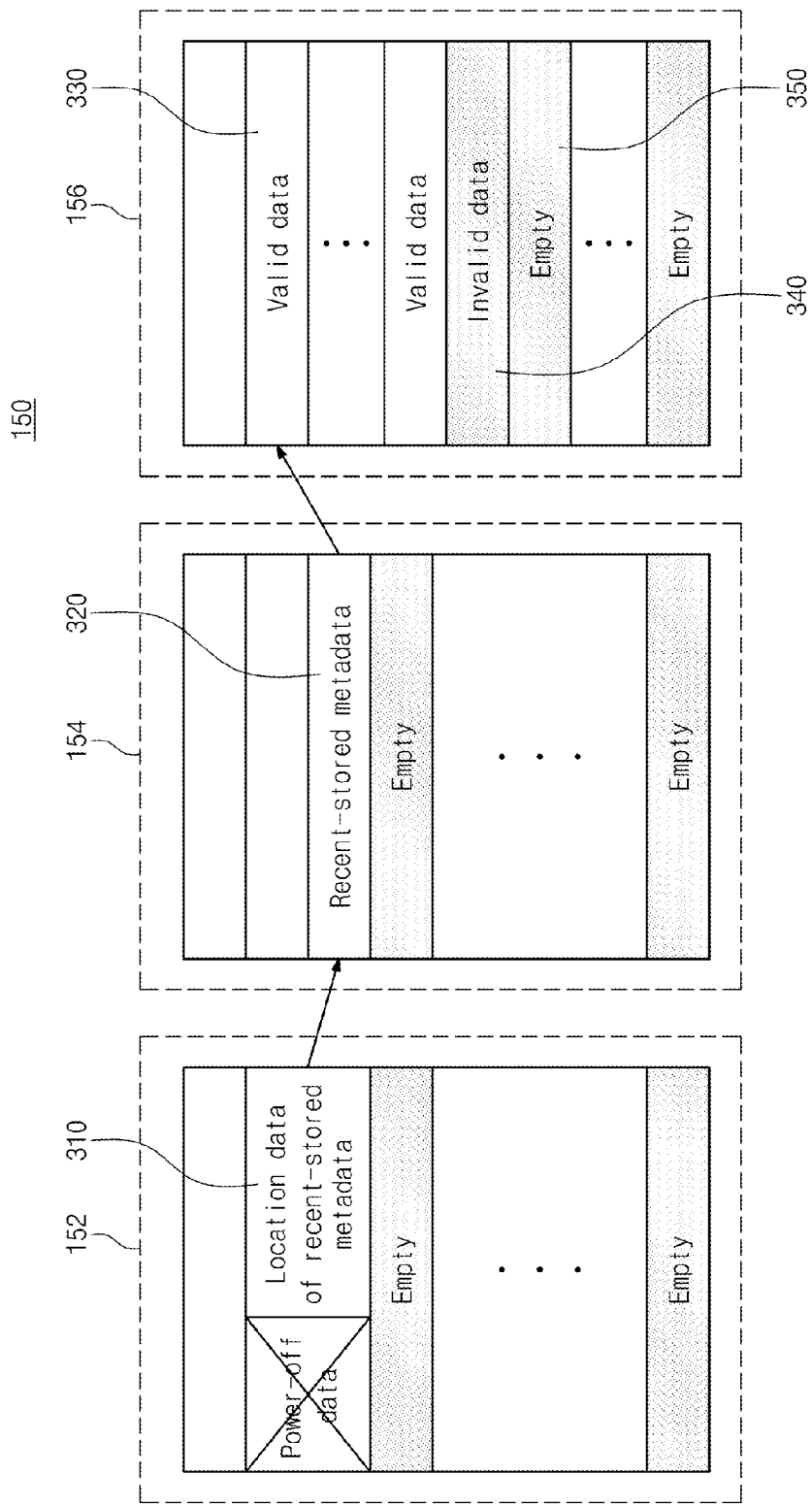

FIG. 7 is another conceptual diagram further describing a management method for a nonvolatile memory system incorporated in an embodiment of the inventive concept. In contrast to the method of FIG. 6, the management method of FIG. 7 assumes a previous power-off that was abnormally performed. Otherwise, similar assumptions regarding the enabling memory system 120 are made.

Since the memory system 120 including nonvolatile memory 150 was not normally powered off, the corresponding power-off data resulting from a normal power-off will not be stored in the P-O & M-L storing area 152. Accordingly, the memory controller 140 will determine that the previous power-off for the nonvolatile memory system 120 was abnormal.

As a result, the memory controller 140 searches for one or more erroneous page(s) in the nonvolatile memory 150. In at least one exemplary embodiment of the inventive concept, the recently stored metadata 320 is searched based on location data 310 of metadata stored when the nonvolatile memory 150 was last normally powered off. Valid data is stored in a page 330 of the user data area 156 as indicated by the recently stored metadata 320. This is because an operation of updating metadata indicating a page where valid data is to be programmed is not performed when the power-off of the nonvolatile memory device is abnormal. Hence, the memory controller 140 may search for an erroneous page beginning with page 330 of the user data area 156.

According to the above process, once a first erroneous page 340 is identified, dummy data is programmed in the page 340 where valid data is not apparent. In the illustrated embodiment of FIG. 7, dummy data may also be programmed in an empty page 350 (a second erroneous page) that is "next to" the first erroneous page 340.

Figure 8:
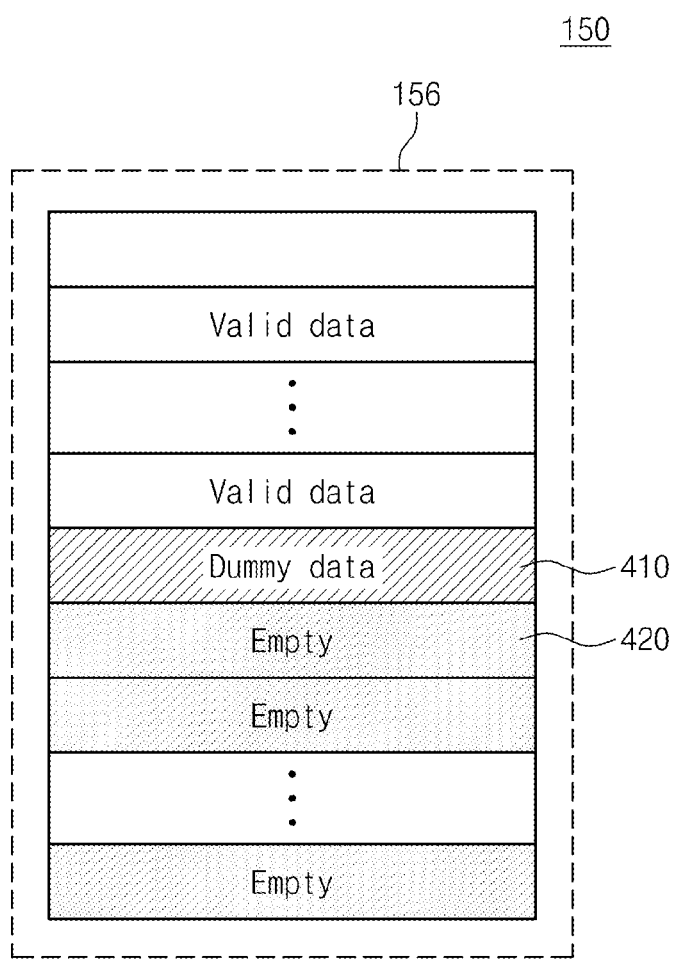
FIGS. 8 and 9 are conceptual diagrams describing results that may arise from a nonvolatile memory device being managed according to an embodiment of the inventive concept.
Figure 9:
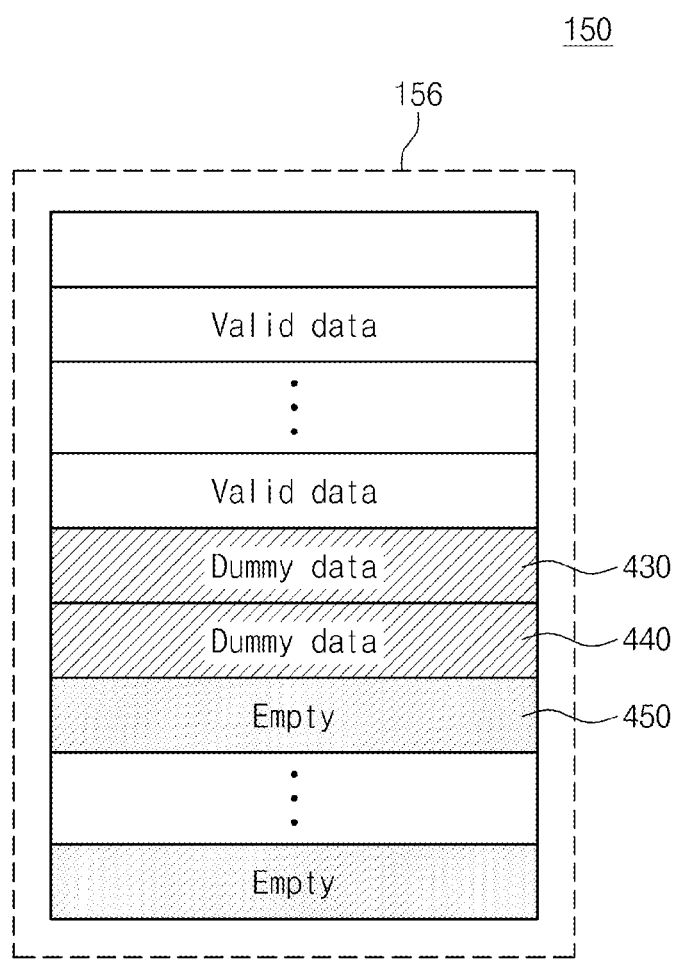

FIGS. 8 and 9 are respective conceptual diagrams further describing results wherein a nonvolatile memory system is managed in accordance with a management method consistent with embodiments of the inventive concept. FIGS. 8 and 9 show the results of managing available memory space following an abnormal power-off. FIGS. 8 and 9 are diagrams assuming, consistent with the former working examples, a user data storing area 156 for the nonvolatile memory 150.

FIG. 8 shows a case wherein dummy data 410 is programmed to only a first erroneous page 340. In such a case, valid data may be programmed in one or more pages next to the rehabilitated erroneous page. That is, page 420 is assumed to be a normal empty page next to the dummy data 410 of the first erroneous page.

In contrast, FIG. 9 shows a case wherein dummy data 410 is programmed to not only an erroneous page 430, but also to a page 440 next to the erroneous page 430. In such a case, valid data may be programmed beginning with empty page 450.

Thus, FIGS. 8 and 9 illustrate two simple approaches to the definition of erroneous pages. Those skilled in the art will recognize others based on these teachings. It should be noted that definition of erroneous pages will take into account acceptable numbers of erase operations, acceptable reboot times, etc.

Figure 10:
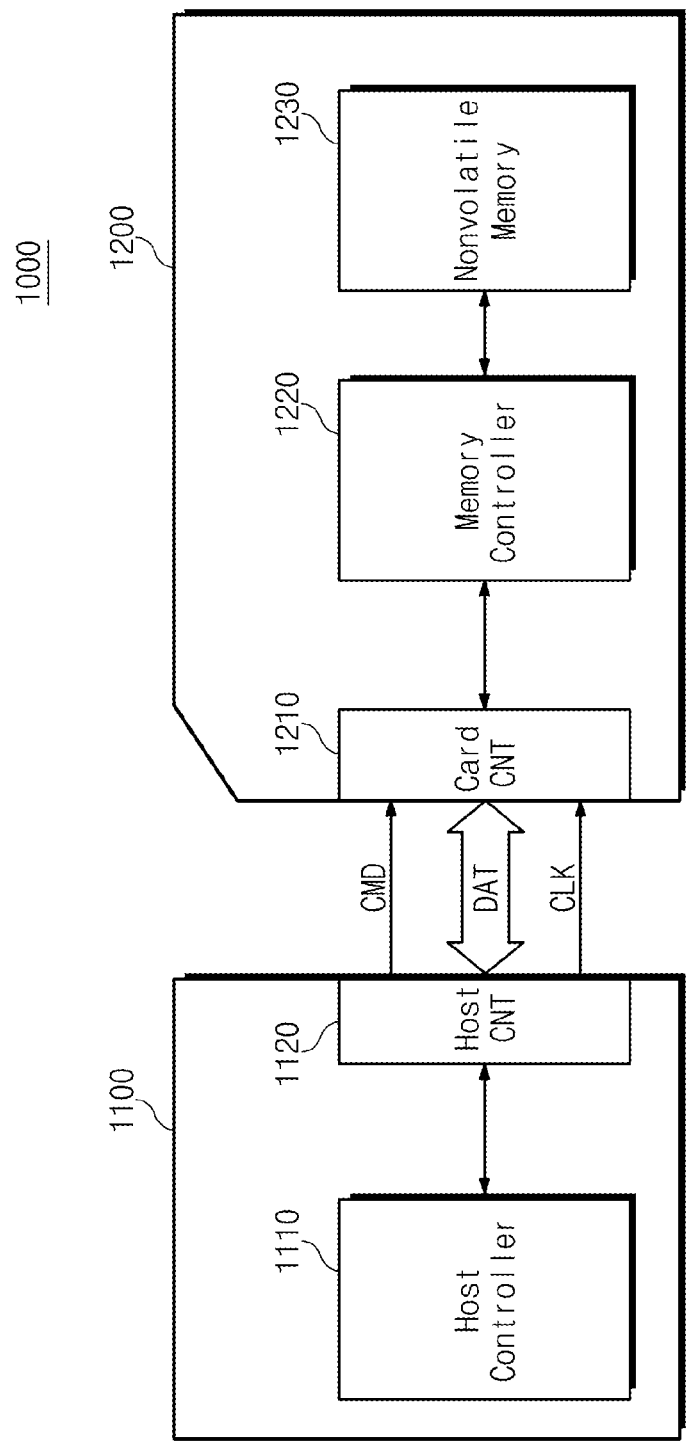
FIG. 10 is a block diagram illustrating a memory card system according to an embodiment of the inventive concept.

FIG. 10 is a block diagram illustrating a memory card system according to an embodiment of the inventive concept. Referring to FIG. 10, a memory card system 1000 includes a host 1100 and a memory card 1200. The host 1100 includes a host controller 1110 and a host connection unit 1120. The memory card 1200 includes a card connection unit 1210, a card controller 1220, and a nonvolatile memory 1230.

Each of the host connection unit 1120 and the card connection unit 1210 may be formed of one or more pins.

Such pins may include a command pin, a data pin, a clock pin, a power pin, and so on. The number of pins may vary according to a type of the memory card 1200. The card connection unit 1210 may be configured to communicate with an external device (e.g., the host 1100) using one of various interface protocols such as USB, MMC, PCI-E, SAS, SATA, PATA, SCSI, ESDI, IDE, and the like.

The host 1100 is configured to write data in the memory card 1200 or to read data stored in the memory card 1200. The host controller 1110 provides a command CMD, a clock signal CLK generated within a clock generator (not shown) of the host 1100, and a data signal DAT to the memory card 1200 via the host connection unit 1120.

The card controller 1220 operates in response to a command provided via the card connection unit 1210. The nonvolatile memory 1230 stores data provided from the host 1100. For instance, if the host 1100 is a digital camera, the nonvolatile memory 1230 may store image data. In exemplary embodiments, the memory card 1200 is formed of an embedded multimedia card (eMMC).

Figure 11:
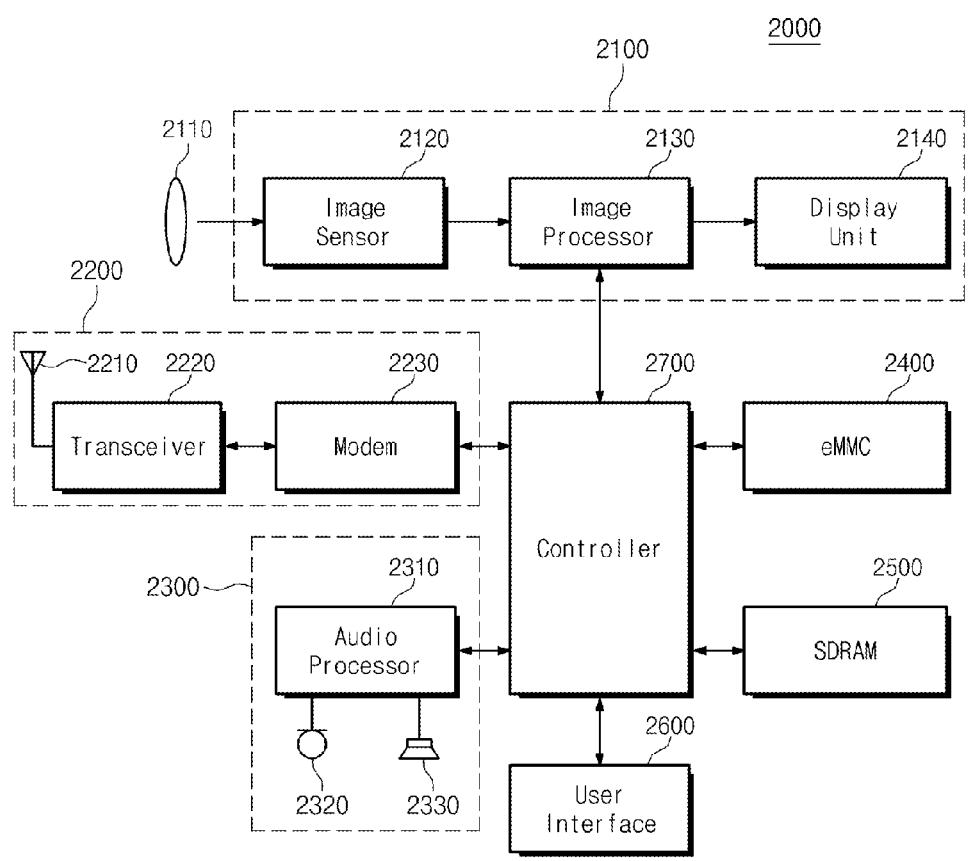
FIG. 11 is a block diagram illustrating a portable terminal according to an embodiment of the inventive concept.

FIG. 11 is a block diagram illustrating a portable terminal according to an embodiment of the inventive concept. Referring to FIG. 11, a portable terminal 2000 according to an embodiment of the inventive concept includes an image processing unit 2100, a wireless transceiver unit 2200, an audio processing unit 2300, an eMMC 2400, an SDRAM 2500, a user interface 2600, and a controller 2700.

The image processing unit 2100 includes a lens 2110, an image sensor 2120, an image processor 2130, and a display unit 2140. The wireless transceiver unit 2200 includes an antenna 2210, a transceiver 2220, and a modem 2230. The audio processing unit 2300 includes an audio processor 2310, a microphone 2320, and a speaker 2330.

The image processing unit 2100, the wireless transceiver unit 2200, the audio processing unit 2300, the eMMC 2400, and the SDRAM 2500 operate to execute user command provided through the user interface 2600 according to control of the controller 2700. Also, the image processing unit 2100, the wireless transceiver unit 2200, the audio processing unit 2300, the eMMC 2400, and the SDRAM 2500 operate to provide a service to the user through the user interface 2600 according to control of the controller 2700.

A memory card, a nonvolatile memory device, and a memory controller according to an embodiment of the inventive concept may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the scope of the inventive concept. Therefore, it should be understood that the above embodiments are not limiting, but illustrative.

What is claimed is:

1. A management method for a memory system including a host and a nonvolatile memory, the management method comprising:
   determining whether the nonvolatile memory was normally or abnormally powered off in response to at least one of a command provided by the host to the nonvolatile memory and power-off data stored in the nonvolatile memory;
   only upon determining that the nonvolatile memory was abnormally powered off, searching for at least one erroneous page among pages of the nonvolatile memory by referencing metadata last stored in the nonvolatile memory before the abnormal power-off, wherein the metadata comprises a valid data page location;
   programming dummy data in the at least one erroneous pages before performing a normal program operation directed to the nonvolatile memory; and
   upon determining that the nonvolatile memory was normally powered off, extracting the valid data page location from the metadata, and erasing the power-off data stored in the nonvolatile memory before performing the normal program operation directed to the nonvolatile memory.

2. The management method of claim 1, wherein the command indicates that the nonvolatile memory was either normally powered off or abnormally powered off in accordance with data stored in the host.

3. The management method of claim 1, further comprising:
   storing the power-off data in the nonvolatile memory in response to a power-off signal provided by the host during a normal power-off.

4. The management method of claim 3, further comprising:
   storing metadata in the nonvolatile memory in response to the power-off signal.

5. The management method of claim 1, further comprising: performing the normal program operation beginning at the valid data page location.

6. The management method of claim 1, wherein searching for the at least one erroneous page among the pages of the nonvolatile memory comprises:
   referencing the metadata last stored in the nonvolatile memory to determine a last page programmed by a program operation immediately preceding the abnormal power-off; and
   identifying the last page as an erroneous page.

7. The management method of claim 6, further comprising:
   further identifying a next page to the last page as an erroneous page.

8. The management method of claim 6, wherein the dummy data is data last programmed during the program operation immediately preceding the abnormal power-off.

9. The management method of claim 1, wherein the dummy data is a predetermined pattern of data.

10. A management method for a memory system including a host and a nonvolatile memory, the management method comprising:
    upon rebooting the nonvolatile memory, executing a first management sequence upon determining that the nonvolatile memory was normally powered off, else executing a second management sequence different from the first management sequence upon determining that the nonvolatile memory was abnormally powered off,
    wherein the first management sequence includes execution of a program operation at a valid data page location extracted from metadata stored in the nonvolatile memory and including a valid data page location and erasing of power-off data stored in the nonvolatile memory before performing the program operation, and
    wherein the second management sequence includes execution of the program operation only after searching for at least one erroneous page among pages of the nonvolatile memory by referencing the metadata and programming dummy data to the at least one erroneous page.

11. The management method of claim 10, wherein the determination that the nonvolatile memory was either normally powered off or abnormally powered off is made in response to a command provided by the host.

12. The management method of claim 10, wherein the determination that the nonvolatile memory was normally powered off is made in response to the power-off data stored in the nonvolatile memory before the rebooting of the nonvolatile memory.

13. The management method of claim 12, wherein the valid data page location is stored in the nonvolatile memory before the rebooting of the nonvolatile memory.

14. The management method of claim 12, further comprising:
 upon successfully rebooting the nonvolatile memory, erasing the power-off data from the nonvolatile memory.

15. The management method of claim 10, wherein the dummy data is a predetermined pattern of data.

16. A memory device, comprising:
 a memory controller; and
 a nonvolatile memory comprising nonvolatile semiconductor memory cells divided into a plurality of N blocks, each block being respectively divided into a plurality of K pages, wherein less than N of the plurality of N blocks is used to store power-off data and location data identifying a location of metadata stored in the nonvolatile memory,
 wherein the memory controller configured to:
  determine whether the nonvolatile memory was normally or abnormally powered off in response to at least one of a command received from a host and the stored power-off data;
  search for at least one erroneous page among the plurality of K pages of the plurality of N blocks of the nonvolatile memory by referencing the metadata, last stored before an abnormal power-off, only upon determining that the nonvolatile memory was abnormally powered off; and
  control the nonvolatile memory to program dummy data in the at least one erroneous page before performing a normal program operation directed to the nonvolatile memory, wherein the dummy data is data last programmed during a program operation immediately preceding the abnormal power-off.

17. The memory device of claim 16, wherein the less than N of the plurality of N blocks is one of the plurality of N blocks.

* * * * *